(12) United States Patent
Masuda et al.

(10) Patent No.: US 7,504,709 B2
(45) Date of Patent: Mar. 17, 2009

(54) ELECTRONIC DEVICE, METHOD OF MANUFACTURING AN ELECTRONIC DEVICE, AND ELECTRONIC APPARATUS

(75) Inventors: Takashi Masuda, Suwa (JP); Hiroshi Takiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 297 days.

(21) Appl. No.: 11/208,783

(22) Filed: Aug. 23, 2005

(65) Prior Publication Data

US 2006/0102894 A1 May 18, 2006

(30) Foreign Application Priority Data

Nov. 5, 2004 (JP) ............... 2004-322976

(51) Int. Cl.
*H01L 29/08* (2006.01)
*H01L 35/24* (2006.01)
*H01L 51/00* (2006.01)
*H01L 23/58* (2006.01)

(52) U.S. Cl. ............ 257/642; 257/40; 257/759; 257/E51.027; 257/E21.007; 438/99; 438/780

(58) Field of Classification Search ............ 257/40, 257/103, E51.007, E51.018, E51.019, E21.024, 257/E51.025, E51.027, E51.029, E51.031, 257/E51.032, E51.035, 642, 759; 106/287.26; 252/62.3 Q, 62.3 R; 438/82, 99, 778, 780, 438/789, 790, 623, FOR. 105, FOR. 139; 570/101, 123–126

See application file for complete search history.

(56) References Cited

U.S. PATENT DOCUMENTS

| | | | |
|---|---|---|---|
| 4,125,534 A * | 11/1978 | Yee | 548/440 |
| 5,596,435 A | 1/1997 | Sunohara et al. | |
| 6,117,567 A | 9/2000 | Andersson et al. | |
| 6,423,428 B1 | 7/2002 | Towns et al. | |
| 6,605,823 B1 * | 8/2003 | Pichler et al. | 257/40 |
| 6,605,904 B2 | 8/2003 | Jenekhe et al. | |
| 6,759,147 B2 | 7/2004 | Verhoeven et al. | |
| 6,794,220 B2 * | 9/2004 | Hirai et al. | 438/99 |
| 6,846,580 B2 * | 1/2005 | Yoshikawa et al. | 428/690 |
| 6,989,290 B2 * | 1/2006 | Aviram | 438/99 |
| 7,081,641 B2 | 7/2006 | Kawasaki et al. | |
| 7,151,341 B2 | 12/2006 | Pichler et al. | |
| 2002/0041151 A1 * | 4/2002 | Park et al. | 313/504 |
| 2003/0059975 A1 * | 3/2003 | Sirringhaus et al. | 438/99 |
| 2003/0113229 A1 * | 6/2003 | Briones et al. | 422/57 |
| 2004/0009368 A1 * | 1/2004 | Otani et al. | 428/690 |
| 2004/0161873 A1 * | 8/2004 | Dimitrakopoulos et al. | 438/99 |
| 2006/0186794 A1 | 8/2006 | Pichler et al. | |
| 2008/0105866 A1 * | 5/2008 | Jeong et al. | 257/40 |

FOREIGN PATENT DOCUMENTS

| | | | |
|---|---|---|---|
| CN | 1227040 A | | 8/1999 |
| JP | A 2004-006782 | | 1/2004 |
| JP | 2004-217913 | * | 8/2004 |
| JP | A-2004-288836 | | 10/2004 |
| JP | A-2005-93542 | | 4/2005 |
| WO | WO 00/79617 | * | 12/2000 |

* cited by examiner

*Primary Examiner*—Michelle Estrada
*Assistant Examiner*—Quovaunda Jefferson
(74) *Attorney, Agent, or Firm*—Oliff & Berridge, PLC

(57) ABSTRACT

An electronic device including: a pair of electrodes; an organic semiconductor layer; and an organic film formed of organic compounds including nonconjugated organic compounds coupled to at least one of surfaces of the pair of electrodes.

19 Claims, 7 Drawing Sheets

ELECTRONIC DEVICE, METHOD OF MANUFACTURING AN ELECTRONIC DEVICE, AND ELECTRONIC APPARATUS

This application claims the benefit of Japanese Patent Application No. 2004-322976, filed Nov. 5, 2004. The entire disclosure of the prior application is hereby incorporated by reference herein in its entirety.

BACKGROUND

The present invention relates to an electronic device, a method of manufacturing an electronic device; and an electronic apparatus.

In recent years, thin film transistors formed with organic semiconductor materials have been drawing attention as devices capable of replacing thin film transistors formed with inorganic semiconductor materials (See, for examples, Japanese Unexamined Patent Publication No. 2004-6782.).

In such a thin film transistor, an organic semiconductor layer is provided so as to contact with a source electrode and a drain electrode.

In general, source electrodes and drain electrodes, which are made of a metal material, have high activity (reactivity of organic matters). Therefore, reaction between these electrodes and the organic semiconductor materials forming the organic semiconductor layer occurs to alter or degrade the organic semiconductor material, and as a result, the performance of the thin film transistor is problematically degraded with time.

SUMMARY

The present invention has an advantage of providing an electronic device capable of preventing the performance from being degraded with time, a method of manufacturing such an electronic device, and an electronic apparatus.

The advantage described above is obtained by the present invention described below.

An electronic device according to an aspect of the invention includes a pair of electrodes, an organic semiconductor layer, and an organic film formed of organic compounds including nonconjugated organic compounds coupled to at least one of surfaces of the pair of electrodes.

Thus, an electronic device superior in the performance and capable of preventing degradation of the performance with time can be obtained.

In the electronic device according to this aspect of the invention, the pair of electrodes respectively forms a source electrode and a drain electrode, and further, the electronic device preferably comprises a gate electrode for applying an electric field to the organic semiconductor layer to form a transistor.

Although the electronic device according to this aspect of the invention can be applied as various things, application as a transistor is especially suitable.

In the electronic device according to this aspect of the invention each of the organic compounds includes a coupling group for coupling to the electrode, and the at least one of the surfaces preferably includes an area to which the coupling group is prevented from coupling.

Thus, the charges can efficiently be transferred between the electrode and the organic semiconductor layer via the organic film.

In the electronic device according to this aspect of the invention each of the organic compounds includes a coupling group for coupling to the electrode, and the at least one of the surfaces preferably includes an area to which the coupling group can further be coupled.

Thus, the charges can efficiently be transferred between the electrode and the organic semiconductor layer via the organic film.

In the electronic device according to this aspect of the invention each of the organic compounds includes a coupling group for coupling to the electrode, and the coupling group is preferably SH group.

Since SH group can form particularly strong coupling with metals, by using organic compounds having SH group as the coupling group, the organic film having high adhesiveness with the electrode can be obtained.

In the electronic device according to this aspect of the invention, each the organic compounds preferably includes a substitutional group capable of supplying the organic semiconductor layer with charges at the opposite side to the coupling group.

Thus, the charges can further efficiently be transferred between the electrode and the organic semiconductor layer via the organic film.

In the electronic device according to this aspect of the invention, each of the organic compounds preferably has a shape of straight chain, and the maximum thickness of the organic film is smaller than a distance between the coupling group and the substitutional group of each of the organic compounds.

Accordingly, since the thickness of the organic film can be thin even if the resistivity of the organic film is relatively high, the performance of the thin film transistor can be prevented from degrading.

In the electronic device according to this aspect of the invention, each of the organic compounds preferably has a structure presenting a water repellent property at the opposite side to the coupling group.

Thus, the moisture or the like can be prevented from adhering to the surface of the electrode even if the electronic device is exposed to an environment of relatively high humidity such as the atmospheric environment. As a result, the degradation in performance of the electronic device caused by moisture adhered to the surface of the electrode can be prevented.

In the electronic device according to this aspect of the invention, each of the nonconjugated organic compounds is preferably described as a general formula: $CF_3(CF_2)_m(CH_2)_n SH$, m representing an integer from 1 to 35, n representing an integer from 2 to 33.

By forming the organic film using such a nonconjugated organic compounds as a principal material, the electronic device becomes to have a superior performance, and even if it is exposed to an environment of relatively high humidity, the superior performance can more surely be maintained.

In the electronic device according to this aspect of the invention, m and n of the general formula preferably satisfies a relationship of $0.25 \leq m/n \leq 18$.

By thus configured, each of the nonconjugated organic compounds represented by the general formula described above has sufficiently high proportion of the fluoro group in the molecular structure to exert a particularly high water-repellent property.

In the electronic device according to this aspect of the invention, each of the nonconjugated organic compounds preferably has a total carbon number of 4 through 45.

Thus, the resistivity of the organic film can be prevented from unnecessarily rising while surly preventing the electrode from contacting with the organic semiconductor layer, as a result, degradation of the electronic device in the performance can be prevented.

In the electronic device according to this aspect of the invention, the number of the organic compounds coupled to the surface of the electrode is preferably in a range of $0.05 \times 10^{15}$ through $0.96 \times 10^{15}/cm^2$ in the electrode provided with the organic film.

Thus, the charges can further efficiently be transferred between the electrode and the organic semiconductor layer via the organic film.

In the electronic device according to this aspect of the invention, the electrode provided with the organic film is preferably prevented from directly contacting with the organic semiconductor layer by presence of the organic film.

Thus, the reaction between the organic semiconductor material forming the organic semiconductor layer and the electrode can be prevented to prevent alteration or degradation of the organic semiconductor layer. As a result, the performance of the thin film transistor can preferably be prevented from being degraded with time.

In the electronic device according to this aspect of the invention, the electrode provided with the organic film is preferably composed of one or more of Au, Ag, Cu, Pt, and alloys including one or more of Au, Ag, Cu, and Pt as a principal material.

These materials are preferable because they can easily form a coupling with an organic compound forming the organic film.

A method of manufacturing an electronic device having a pair of electrodes and an organic semiconductor layer according to another aspect of the invention includes the following steps:

(a) forming an organic film by coupling organic compounds including nonconjugated organic compounds to at least one of surfaces of the pair of electrodes; and (b) forming the organic semiconductor layer so as to contact with the organic film.

Thus, an electronic device superior in the performance and capable of preventing degradation of the performance with time can be manufactured.

The method according to this aspect of the invention preferably includes the following step prior to the step (a): cleaning at least the surface of the electrode to be provided with the organic film, wherein the cleaning step is executed with an oxygen plasma treatment.

If the oxygen plasma treatment is executed on the surface of the electrode, an uneven section or a defective section to which the organic compounds forming the organic film are hard to be coupled, for example, is formed on the surface of the electrode, thus, the coupling rate (reaction rate) or the coupling density of the organic compounds to the surface of the electrode can easily be controlled.

In the method according to this aspect of the invention, the organic film is preferably formed in the step (a) by contacting an organic film forming fluid including the organic compounds having a concentration of 0.01 through 10 mM with the surface of the electrode to be provided with the organic film for 0.1 through 200 minutes.

Thus, the charges can further efficiently be transferred between the electrode and the organic semiconductor layer via the organic film.

An electronic apparatus according to still another aspect of the invention includes the electronic device according to the above aspect of the invention.

Thus, the electronic apparatus with high reliability can be obtained.

BRIEF DESCRIPTION OF THE DRAWINGS

The invention will now be described with reference to the accompanying drawings, wherein like numbers refer to like elements, and wherein.

DETAILED DESCRIPTION OF EMBODIMENTS

Figure 1A:
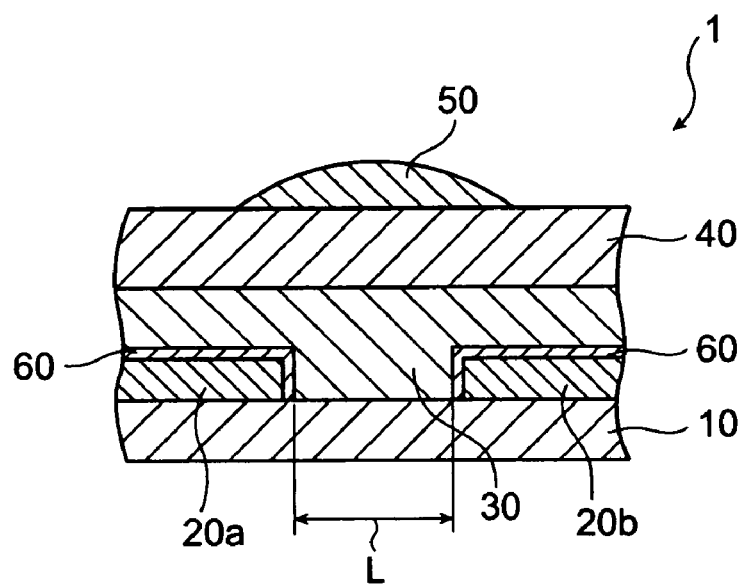
FIGS. 1A and 1B are schematic views showing a first embodiment of applying an electronic device according to the invention as a thin film transistor.

An electronic device, a method of manufacturing the electronic device, and an electronic apparatus according to the invention will hereinafter be described in accordance with some preferred embodiments illustrated in the drawings.

First Embodiment

Firstly, a case in which an electronic device according to the invention is applied as a thin film transistor will be described as a representative thereof.

Figure 1B:
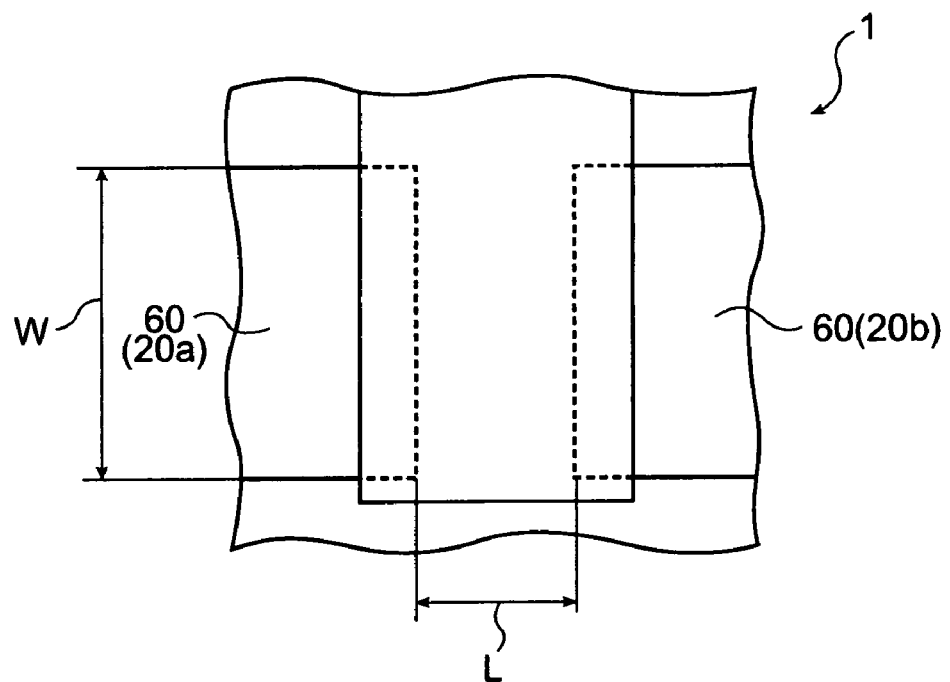

FIGS. 1A and 1B are schematic views (FIG. 1A is a vertical cross-sectional view and FIG. 1B is a plan view.) showing a first embodiment of the case in which the electronic device according to the invention is applied as a thin film transistor, and each of FIGS. 2A through 2C, 3A, and 3B is a view (a vertical cross-sectional view) for explaining a manufacturing method of the thin film transistor shown in FIGS. 1A and 1B.

The thin film transistor 1 shown in FIG. 1A and 1B is a top-gate thin film transistor provided on a substrate 10 and includes a source electrode 20a and a drain electrode 20b provided so as to be separated from each other, an organic semiconductor layer 30 provided so as to cover the source electrode 20a and the drain electrode 20b, and a gate insulating layer 40 positioned between the organic semiconductor layer 30 and a gate electrode 50.

Hereinafter, a configuration of each of the sections is sequentially described.

The substrate 10 is a member for supporting each of the layers (each of the sections) composing the thin film transistor 1.

As the substrate 10, a plastic substrate (a resin substrate) made of polyethylene terephthalate (PET), polyethylene naphthalate (PEN), polyethersulfone (PES), aromatic polyester (liquid crystal polymer), polyimide (PI), or the like, a grass substrate, a quartz substrate, a silicon substrate, a gallium arsenide substrate and so on, for example, can be used.

If the thin film transistor 1 needs to have flexibility, a plastic substrate or a thin (relatively small in the thickness) metal substrate is selected as the substrate 10.

On the substrate 10, there are provided the source electrode 20a and the drain electrode 20b (a pair of electrodes). In other words, the source electrode 20a and the drain electrode 20b are provided on substantially the same plane.

As a composing material of the source electrode 20a and the drain electrode 20b, metal materials such as, for example, Au, Ag, Cu, Pt, Ni, Cr, Ti, Al, or a metal alloy including such a metal can be cited, and one or more of the metal materials can be used in combination.

In these materials, a material mainly composed of Au, Ag, Cu, or Pt, or a metal alloy including such a metal is preferable as the composing material of the source electrode 20a, or the drain electrode 20b. These materials are preferable because they can easily form a coupling to an organic compound described below. Further, since these materials have relatively large work functions, if the organic semiconductor layer 30 is the p-type, the efficiency of injecting positive holes (carriers) to the organic semiconductor layer 30 can be enhanced by forming the source electrode 20a with these materials, as described below.

Note that the average thicknesses of the source electrode 20a and the drain electrode 20b are not limited, but are preferably in a range of about 10 through 2000 nm, and are further preferably in a range of about 50 through 1000 mn.

On a surface of each of the source electrode 20a and the drain electrode 20b (Hereinafter, they may collectively be referred to as "an electrode 20."), there is formed an organic film 60.

The organic film 60 is made by coupling organic compounds (organic molecules) including nonconjugated organic compounds (nonconjugated organic molecules) on the electrode 20. Note that the organic film 60 can be composed of nonconjugated organic compounds only, or can be composed of nonconjugated organic compounds with other kinds of compounds.

Note also that the organic film 60 is preferably composed of organic compounds consisting primarily of nonconjugated organic compounds.

By providing the organic film 60 on the surface of the electrode 20, the electrode 20 can be prevented from directly contacting with the organic semiconductor layer 30. Thus, the reaction between the organic semiconductor material forming the organic semiconductor layer 30 and the electrode 20 can be prevented to prevent alteration or degradation of the organic semiconductor layer 30. As a result, the performance of the thin film transistor 1 can preferably be prevented from being degraded with time.

Further, by providing the organic film 60, moisture and stains can be prevented from adhering to the surface of the electrode 20. Thus, the performance of the thin film transistor 1 can be improved.

Further, since the organic film 60 having a surface even in a molecular level can be formed, variation in performance in the thin film transistor 1 to be manufactured can be prevented, thus enhancing reliability of an electronic apparatus (a display device or the like described below) implementing the thin film transistor 1.

Further, a portion where coupling groups are not yet coupled, namely, a portion with coupling groups (the organic compounds) capable of coupling preferably remain on the surface of the electrode 20. In general, although a film including nonconjugated organic compounds (especially a film consisting mainly of nonconjugated organic compounds) presents relatively high resistivity, by intentionally keeping possibility of coupling to organic compounds on the surface of the electrode 20, positive holes (charges) can effectively be communicated between the electrode 20 and the organic semiconductor layer 30 via the organic film 60.

In other words, hole injection to the organic semiconductor layer 30 from the source electrode 20a and transfer of holes from the organic semiconductor layer 30 to the drain electrode 20b can effectively be executed via the organic film 60, thus a sufficient amount of drain current (ON current) can be obtained in the thin film transistor 1.

Such an organic film 60 preferably satisfies one of the following conditions I and II, and further preferably satisfies both of them.

Condition I: The organic film 60 is made by contacting a processing fluid (20° C.) containing organic compounds in a concentration of 0.01 through 10 mM to the surface of the electrode 20 preferably for about 0.1 through 200 minutes, more preferably for about 1 through 150 minutes, and further more preferably for 5 through 60 minutes.

Condition II: The number of the organic compounds coupled to the surface of the electrode 20 is preferably about $0.05 \times 10^{15}$ through $0.96 \times 10^{15}$ parts/cm$^2$, more preferably about $0.20 \times 10^{15}$ through $0.94 \times 10^{15}$ parts/cm$^2$, and further more preferably about $0.50 \times 10^{15}$ through $0.92 \times 10^{15}$ parts/cm$^2$.

By arranging the organic film 60 to satisfy such conditions, the organic film 60 can sufficiently prevent the electrode 20 from contacting to the organic semiconductor layer 30, and further, the transfer of holes (carriers) between the electrode 20 and the organic semiconductor layer 30 via the organic film 60 can efficiently be executed.

The organic compounds forming the organic film 60 have coupling groups on an end section at a side to be coupled to the surface of the electrode 20. The coupling group is not limited as long as it can form chemical coupling to the metal forming the electrode 20 described above, and SH group, RO group (R denotes alkyl.), and SiOR can be cited, but SH group is preferable. Since SH group can form particularly strong coupling with metals, by using organic compounds having SH group as the coupling group, the organic film 60 having high adhesiveness with the electrode 20 can be obtained.

Further, each of the organic compounds preferably has a substitutional group (a substitutional group having a dopant property) capable of supplying positive holes (charges) to the organic semiconductor layer 30 at the opposite side to the side coupled to the surface of the electrode 20. Thus, the transfer of the positive holes between the electrode 20 and the organic semiconductor layer 30 via the organic film 60 can further efficiently be executed.

Further, each of the organic compounds preferably has a structure presenting a water-repellent property at the opposite side to the side (with the coupling groups) to be coupled to the surface of the electrode 20. Thus, the moisture or the like can be prevented from adhering to the surface of the electrode 20 even if the thin film transistor 1 is exposed to an environment of relatively high humidity such as the atmospheric environment. As a result, the degradation in performance (especially increase in the OFF current) of the thin film transistor 1 caused by the moisture adhered to the surface of the electrode 20 can be prevented.

Taking the above into consideration, each of the organic compounds preferably has a fluoro group at the opposite side to the side to be coupled to the surface of the electrode 20. According to the fluoro group, only by introducing one kind of functional group at the opposite side of each of the organic compounds to the side to be coupled to the surface of the electrode 20, the organic compounds preferably exerting both of the dopant property and the water-repellent property can be obtained.

Further, although each of the nonconjugated organic compounds can include a branch structure or a ring structure in its molecule, those without such structures, namely, those forming a straight chain (a straight-chain structure) are preferable. Thus, the nonconjugated organic compounds are coupled to the surface of the electrode 20 with particular regularity, thus obtaining the organic film 60 having further good film characteristics.

In view of the above points, straight-chain compounds each having the SH group as the coupling group for coupling to the surface of the electrode 20 and the fluoro group at the opposite side to the SH group are preferably used as the nonconjugated organic compounds, in particular, the compounds represented by the following general formula are used preferably. $CF_3(CF_2)_m(CH_2)_nSH$ (where, m denotes an integer from 1 to 35, and n denotes an integer from 2 to 33.). Since such nonconjugated organic compounds present excellent characteristics in the dopant property and the water-repellent property, by composing the organic film 60 using such nonconjugated organic compounds as the main composing materials, the thin film transistor 1 can obtain a large amount of drain current (ON current), and can surely maintain its excellent performance even if it is exposed to an environment of relatively high humidity.

Further, in the above general formula, the value m/n preferably satisfies 0.25 through 18, more preferably satisfies 0.25 through 10, and further more preferably satisfies 1 through 7. By thus configured, each of the nonconjugated organic compounds represented by the general formula described above has sufficiently high proportion of the fluoro group in the molecular structure to exert a particularly high water-repellent property.

Further, the carbon number of each of the conjugated organic compounds is preferably 4 through 45, and more preferably 10 through 42. If the total carbon number is too small, there is a possibility that the organic film 60 cannot sufficiently prevent the electrode 20 from contacting with the organic semiconductor layer 30 depending on the number of the organic compounds coupled to the surface of the electrode 20. If, in contrast, the total carbon number is too large, there is a possibility that the resistivity of the organic film 60 unnecessarily increases to degrade the performance of the thin film transistor 1.

Note that as the nonconjugated organic compounds, other compounds than described above such as, for example, saturated hydrocarbons having the SH groups or the derivatives thereof can also be used. As the derivatives thereof, those having, for example, OH group, NH2 group, COOH group or the like at the end opposite to the SH group can be cited.

The distance between the source electrode 20a provided with the organic film 60 and the drain electrode 20b provided with the organic film 60, namely the channel length L shown in FIGS. 1A and 1B is preferably about 2 through 30 μm, and more preferably about 2 through 20 μm. By setting the amount of channel length L in such a range, the performance of the thin film transistor 1 can be improved (especially the ON current can be increased.).

Further, the length of the source electrode 20a provided with the organic film 60 and the drain electrode 20b provided with the organic film 60, namely the channel width W shown in FIG. 1B is preferably about 0.1 through 5 mm, and more preferably about 0.3 through 3 mm. By setting the amount of the channel width W in such a range, a parasitic capacitance can be reduced, thus preventing degradation in performance of the thin film transistor 1. Further, increase in size of the thin film transistor 1 can also be prevented.

On the substrate 10, there is provided the organic semiconductor layer 30 so as to cover the source electrode 20a and the drain electrode 20b and to contact with the organic film 60.

In the present embodiment, the organic semiconductor layer 30 is mainly composed of a p-type semiconductor material. As the p-type organic semiconductor material, both of polymer organic semiconductor materials and small molecule organic semiconductor can be used.

As the polymer semiconductor material, for example, poly (3-alkylthiophene), poly(3-hexilthiophene)(P3HT), poly(3-octhylthiophene), poly(2,5-thienylene vinylene)(PTV), poly (para-phenylene vinylene)(PPV), poly(9,9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole)(BT), fluorine-triallylamine copolymer, triallylamine polymer, fluorene-bithiophene copolymer (F8T2) and so on can be cited.

As the small molecule semiconductor, for example, C60, metallic phthalocyanine, substitutional derivatives of C60 or metallic phthalocyanine, acene molecular materials such as anthracene, tetracene, pentacene, or hexacene, or α-oligothiophenes, specifically quarterthiophene (4T), sexithiophene (6T), octithiophene (8T), dihexylquarterthiophene (DH4T), dihexylsexithiophene (DH6T), or the like can be cited.

Particularly in these materials, the p-type organic semiconductor layer 30 is preferably composed of an organic semiconductor material including a thiophene structure as a principal material. Since an organic semiconductor material including the thiophene structure has high carrier mobility, by forming the organic semiconductor layer 30 using such an organic semiconductor material as a principal material, the performance of the thin film transistor 1 can be improved.

Further, since an organic semiconductor material including the thiophene structure has particularly high reactivity with metals, it is particularly effective to apply the invention as the thin film transistor 1 provided with the organic semiconductor layer 30 composed of such an organic semiconductor material as the principal material.

Further, since the organic semiconductor layer 30 is directly contacted with the organic film 60, transfer of positive holes (carriers) between the electrode 20 and the organic semiconductor layer 30 can further efficiently be executed. As a result, the performance of the thin film transistor 1 can further be improved.

The average thickness of the organic semiconductor layer 30 is not particularly limited, but is preferably in a range about 0.1 through 1000 nm, and more preferably in a range of about 1 through 500 nm, and further more preferably in a range of about 1 through 100 nm.

The gate insulating layer (an insulator layer) 40 is provided on the organic semiconductor layer 30, namely across the organic semiconductor layer 30 from the source electrode 20a and the drain electrode 20b.

The gate insulating layer 40 is provided for insulating a gate electrode (a third electrode) 50 described below from the source electrode 20a and the drain electrode 20b.

As a composing material of the gate insulating layer 40, the kind of gate insulating materials known to the public is not particularly limited, and both of an organic material and an inorganic material can be used therefor.

As an organic material, polymethylmethacrylate, polyvinyl phenol, polyimide, polystyrene, polyvinyl alcohol, polyvinyl acetate, polyvinyl phenol, and so on can be cited, and one or more of these materials can be used alone or in combination.

Meanwhile, as an inorganic material, a metal oxide such as silica, silicon nitride, aluminum oxide, or tantalum oxide, and a metal complex oxide such as barium strontium titanate, lead zirconate titanate can be cited, and one or more of these materials can be used alone or in combination.

The average thickness of the gate electrode 40 is not particularly limited, but is preferably in a range of about 10 through 5000 nm, and is further preferably in a range of about 100 through 2000 nm. By arranging the gate insulating layer 40 to have the thickness of the range described above, the operating voltage of the thin film transistor 1 can be lowered while surely insulating the gate electrode 50 from the source electrode 20a and the drain electrode 20b.

Note that the gate insulating layer 40 is not limited to be of a single layer structure, but can be of a stacked layer structure including a plurality of layers.

At a predetermined position on the gate insulating layer 40, namely at the position corresponding to an area between the source electrode 20a and the drain electrode 20b, there is provided the gate electrode 50 for applying the organic semiconductor layer 30 with an electric field.

As a composing material of the gate electrode 50, the kind of electrode materials known to the public is not particularly limited. Specifically, a metallic material such as Cr, Al, Ta, Mo, Nb, Cu, Ag, Au, Pb, In, Ni, Nd, Co, or a metal alloy including these metals, and an oxide of the metal material can be used therefor.

Further, the gate electrode 50 can also be composed of a conductive organic material.

The average thickness of the gate electrode 50 is not particularly limited, but is preferably in a range of about 0.1 through 2000 nm, and is further preferably in a range of about 1 through 1000 nm.

In such a thin film transistor 1, when the gate electrode 50 is supplied with the gate voltage while the source electrode 20a and the drain electrode 20b are supplied with a predetermined voltage, a channel region is formed around the interface between the organic semiconductor layer 30 and the gate insulating layer 40, and movement of carriers (positive holes) in the channel region causes a current between the source electrode 20a and the drain electrode 20b to flow.

Namely, in an OFF state in which no voltage is applied to the gate electrode 50, even if some voltage is applied between the source electrode 20a and the drain electrode 20b, only a vary little current flows because carriers hardly exist in the organic semiconductor layer 30.

In contrast, in an ON state in which substantial voltage is applied to the gate electrode 50, an electrical charge is induced in a part of the organic semiconductor layer 30 facing the gate electrode 40 to form the channel (the flow channel for the carriers). In this condition, if substantial voltage is applied between the source electrode 20a and the drain electrode 20b, the current flows through the channel region.

The thin film transistor 1 described above can be manufactured as follows, for example.

The manufacturing method of the thin film transistor 1 shown in FIGS. 1A and 1B includes [A1] the step of forming the source electrode 20a and the drain electrode 20b, [A2] the step of forming the organic film 60 on the surfaces of the source electrode 20a and the drain electrode 20b, [A3] the step of forming the organic semiconductor layer 30 so as to cover the source electrode 20a and the drain electrode 20b provided with the organic film 60, [A4] the step of forming the gate insulating layer 40 on the organic semiconductor layer 30, and [A5] the step of forming the gate electrode 50 on the gate insulating layer 40.

[A1] Source Electrode and Drain Electrode Forming Step

Figure 2A:
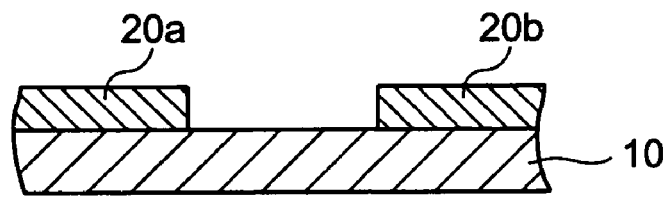
FIGS. 2A through 2C are views (vertical cross-sectional views) for explaining a manufacturing method of the thin film transistor shown in FIGS. 1A and 1B.

Firstly, the source electrode 20a and the drain electrode 20b are formed on the substrate 10 (See FIG. 2A.).

The source electrode 20a and the drain electrode 20b can be formed using, for example, an etching process, a liftoff process, or the like.

If the etching process is used for forming the source electrode 20a and the drain electrode 20b, a metal film (a metal layer) is firstly formed on the whole surface of the substrate 10 using, for example, a sputtering process, a vapor deposition process, a plating process, or the like (I). Subsequently, a resist layer is formed on (the surface of) the metal layer using, for example, a photolithography process, a microcontact printing process, or the like (II). And, subsequently, the metal layer is patterned to be a predetermined shape by etching using the resist layer as a mask (III).

Further, if the liftoff process is used for forming the source electrode 20a and the drain electrode 20b, a resist layer is firstly formed in other areas than the areas to be provided with the source electrode 20a or the drain electrode 20b (I). Subsequently, a metal film (a metal layer) is formed using, for example, a vapor deposition process, a plating process, or the like on the whole surface of the substrate 10 to which the resist layer is provided (II). And then, the resist layer is removed (III).

[A2] Organic Film Forming Step (First Step)

Figure 2B:
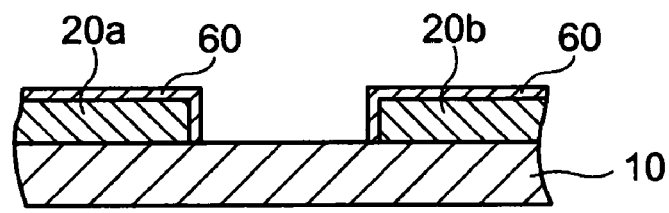

Subsequently, the organic film 60 is formed on the surfaces of the source electrode 20a and the drain electrode 20b (See FIG. 2B.).

Firstly, the substrate 10 provided with the source electrode 20a and the drain electrode 20b is cleaned.

As a cleaning process of the substrate 10 (the electrode 20), for example, a washing process with a washing agent, an oxygen plasma treatment, an argon plasma treatment, an ultraviolet/ozone treatment, and so on can be cited. Each of these cleaning processes can be executed alone or in combination with one or more of these cleaning processes.

By executing a plurality of cleaning processes, for example, by executing at least one of the oxygen plasma treatment, the argon plasma treatment, and the ultraviolet/ozone treatment after washing the substrate with the washing agent and then drying it, the surfaces of the source electrode 20a and the drain electrode 20b can highly be cleaned.

In these cleaning processes, the oxygen plasma treatment is preferable as the cleaning process for the substrate 10 (the electrode 20). If the oxygen plasma treatment is executed on the surface of the electrode 20, an uneven section or a defective section to which the organic compounds forming the organic film 60 are hard to be coupled, for example, is formed on the surface of the electrode 20. Thus, the coupling rate (reaction rate) or the coupling amount (coupling density) of the organic compounds to the surface of the electrode 20 can easily be controlled, thus the number of coupling of the organic compounds can easily be set in the range described above. As a result, the performance of the thin film transistor 1 can be improved.

In particular, by lowering the coupling density of the organic compounds, a section to which no organic compound is coupled can be formed on the surface of the electrode 20. Further, it becomes difficult for the straight-chain organic compounds to stand on the surface of the electrode 20, and those lying down are increased. As a result, since the thickness of the organic film 60 can be thin, even if the resistivity of the organic film 60 is relatively high, the performance of the thin film transistor 1 can be prevented from degrading.

For example, if the organic compound includes a substitutional group (the substitutional group having the dopant property), the maximum thickness of the organic film 60 is preferably shorter than the distance between the coupling group and the substitutional group of the organic compound. Thus the effectiveness described above can further be enhanced.

The condition in the oxygen plasma treatment is preferably set as follows.

A pure oxygen gas is preferably used as the process gas.

Further, the flow rate of the process gas is preferably in a range of about 10 through 500 sccm, and further preferably in a range of about 50 through 400 sccm.

Further, the RF power is preferably in a range of about 0.005 through 0.2 W/cm$^2$, and further preferably in a range of about 0.05 through 0.1 W/cm$^2$.

Still further, the time for the oxygen plasma treatment (the process time) is preferably in a range of about 1 through 600 sec, and further preferably in a range of about 180 through 360 sec.

Further, the temperature of the ambient atmosphere (the ambient temperature) in the oxygen plasma treatment is preferably in a range of about 0 through 100° C., and further preferably in a range of about 20 through 50° C.

Still further, the pressure of the ambient atmosphere (the ambient pressure) in the oxygen plasma treatment process is preferably set to negative-pressure (e.g., about $1\times10^{-1}$Pa).

Subsequently, the organic film forming fluid containing the organic compounds described above is brought into contact with the surface of the electrode 20. Thus, the metal material forming the electrode 20 and the coupling groups provided to the organic compounds react with each other, thus the organic compounds are coupled to the surface of the electrode 20 to form the organic film 60.

As the method of bringing the organic film forming fluid into contact with the surface of the electrode 20, for example, a method of dipping the substrate 10 into the organic film forming fluid, a method of spraying the organic film forming fluid to the substrate 10 like a shower, a method of bringing the side of the substrate provided with the electrode 20 into contact with the organic film forming fluid, or the like can be used.

As a solvent used for preparing the processing fluid, for example, ethanol, chloroform, dichloromethane, dimethylformamide, 1,4-dioxane, butyl acetate, xylene, propanol, water, and so on can be cited, and used alone or in combination.

[A3] Organic Semiconductor Layer Forming Step (Second Step)

Figure 2C:
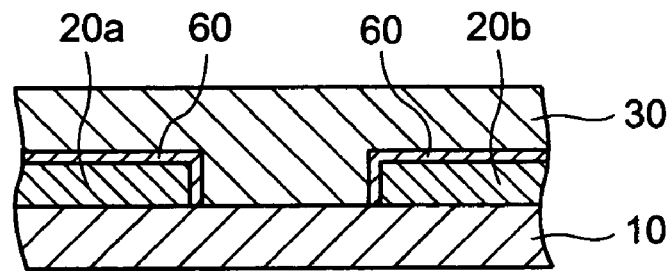
Figure 3A:
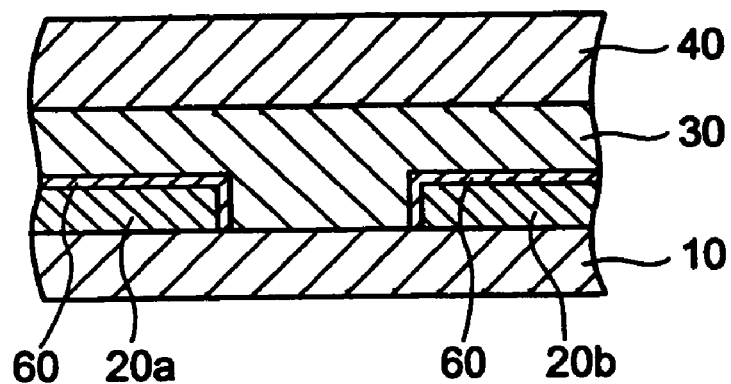
FIGS. 3A and 3B are views (vertical cross-sectional views) for explaining the manufacturing method of the thin film transistor shown in FIGS. 1A and 1B.
Figure 3B:
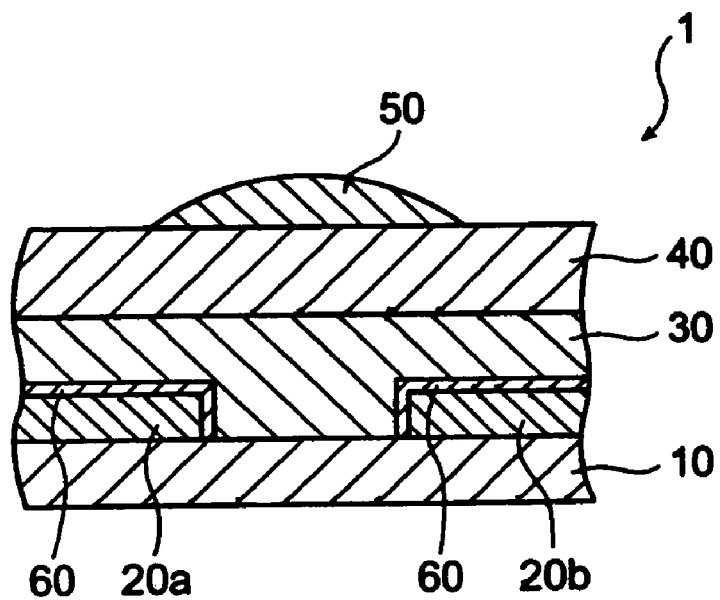

Subsequently, the organic semiconductor layer 30 is formed so as to cover the source electrode 20a and the drain electrode 20b provided with the organic film 60 and to contact with the organic film 60 (See FIG. 2C.).

In this case, the channel region is formed between the source electrode 20a and the drain electrode 20b.

If the organic semiconductor layer 30 is composed of a polymeric organic semiconductor material, the organic semiconductor layer 30 can be formed using, for example, a coating process such as a spin-coating process or a dip-coating process, or a printing process such as an ink-jet printing process (a droplet ejecting process) or a screen printing process.

Further, if the organic semiconductor layer 30 is composed of a small molecule organic semiconductor material, the organic semiconductor layer 30 can be formed, for example, using a vapor deposition process, or by forming a coated film of a solution including a precursor of the small molecule organic semiconductor material using a coating process such as a spin-coating process or dip-coating process, or a printing process such as an ink-jet printing process or a screen printing process, and then executing an annealing process on the coated film.

Note that the area in which the organic semiconductor layer 30 is formed is not limited to the structure shown in the drawings, and the organic semiconductor layer 30 can selectively be formed in the area (the channel region) defined between the source electrode 20a and the drain electrode 20b. According to this structure, in case a plurality of thin film transistor 1 (element) is arranged on a single substrate, the organic semiconductor layer 30 for each element can separately be formed to reduce leak current and crosstalk between each of the elements. Further, the amount of the organic semiconductor material used therefor can be reduced, thus reducing the manufacturing cost.

[A4] Gate Insulating Layer Forming Step

Subsequently, the gate insulating layer 40 is formed on the organic semiconductor layer 30 (See FIG. 3D.).

For example, if the gate insulating layer 40 is composed of an organic polymeric material, the gate insulating layer 40 can be formed by coating (supplying) a solution including an organic polymeric material or a precursor thereof so as to cover the organic semiconductor layer 30 layer 40, and then executing a post-process (e.g., heating, radiating with an infrared ray, or providing an ultrasonic ray) against the coated film if necessary.

As the method of coating (supplying) the solution including the organic polymeric material or a precursor thereof on the organic semiconductor layer 30, the coating process or the printing process cited in the step [A3] can be used.

Further, if the gate insulating layer 40 is composed of an inorganic material, the gate insulating layer 40 can be formed using, for example, a thermal oxidation process, a CVD process, or a SOG process. Further, by using polysilazane as the material, a silica film or a silicon nitride film can be formed by a wet process as the gate insulating layer 40.

[A5] Gate Electrode Forming Step

Subsequently, the gate electrode 50 is formed on the gate insulating layer 40 (See FIG. 3E.).

Firstly, the metal film (the metal layer) is formed.

The metal film can be formed using, for example, a chemical vapor deposition (CVD) process such as a plasma CVD process, a thermal CVD process, or a laser CVD process, a dry plating process such as a vapor deposition process, a sputtering process (a low-temperature sputtering process), or a ion plating process, a wet plating process such as an electrolytic plating process, an immersion plating process, or an electroless plating process, a thermal spraying process, a sol-gel process, or a MOD process, or by bonding a metal foil.

A resist material is coated on the metal film and then cured to form a resist layer having a shape corresponding to the gate electrode 50. Unnecessary portions of the metal film are then removed using the resist layer as a mask.

For removing the metal film, for example, one or more of processes including physical etching processes such as a plasma etching process, a reactive ion etching process, a beam etching process, or a photo-assist etching process, and chemical etching processes such as a wet etching process can be used alone or in combination.

After then, the resist layer is moved to obtain the gate electrode 50.

Note that the gate electrode 50 can also be formed by coating (supplying) a conductive material including, for example, conductive particles or a conductive organic material to form a coated film, and then executing a necessary post process (e.g., a heating process, an infrared irradiation process, or an ultrasonic irradiation process) on the coated film.

As the conductive material including the conductive particles, a solution in which metal particles are dispersed, a polymer mixture including conductive particles, and so on can be cited.

Further, as the conductive material including the conductive organic material, a solution and a dispersion liquid of the conductive organic material can be cited.

As the method of coating (supplying) the conductive material on the gate insulating layer 40, for example, the coating processes or the printing processes cited in the description of the step [A3] can be used.

After going through the steps described above, the thin film transistor 1 according to the first embodiment can be obtained.

Note that, although a case in which the organic film 60 is provided on each of the surfaces of the source electrode 20a and the drain electrode 20b is shown in the present embodiment, the organic film 60 can be selectively formed only on the surface of the source electrode 20a but not formed on the surface of the drain electrode 20b.

Further, if the functional group having a dopant property is not introduced to the organic compounds forming the organic film 60, the organic film 60 can be formed on the entire surface of the substrate 10 including the surfaces of the source electrode 20a and the drain electrode 20b.

Further, by selecting kinds of the organic compounds forming the organic film 60, for example, n-type of organic semiconductor layer can also be used as the organic semiconductor layer 30.

Second Embodiment

Hereinafter, a second embodiment of applying the electronic device according to the invention to a thin film transistor will be explained.

Figure 4:
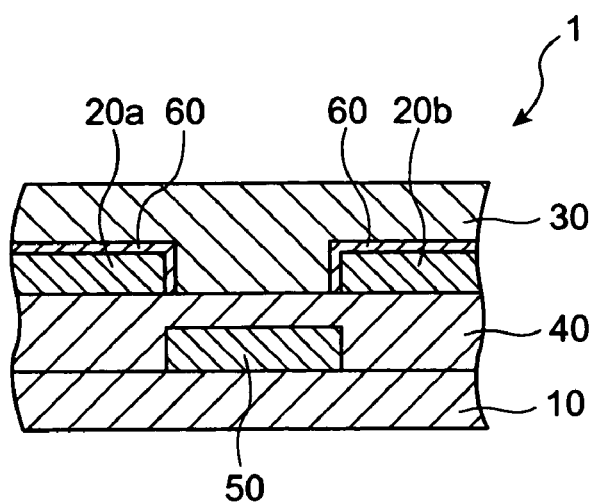
FIG. 4 is a schematic view showing a second embodiment of applying an electronic device according to the invention as a thin film transistor.

FIG. 4 is a schematic cross-sectional view showing the second embodiment of applying an electronic device according to the invention as a thin film transistor.

Hereinafter, a thin film transistor according to the second embodiment is described with a focus mainly on the differences from the first embodiment described above, wherein the descriptions regarding the common matters are omitted.

The thin film transistor 1 according to the second embodiment is different in the overall configuration from the thin film transistor 1 according to the first embodiment and is the same in other sections.

Namely, the thin film transistor 1 shown in FIG. 4 is a bottom gate type of thin film transistor having the gate electrode 50 positioned the substrate 10 side of the source electrode 20a and the drain electrode 20b via the gate insulating layer 40.

And, the organic film 60 formed on the surfaces of the source electrode 20a and the drain electrode 20b has the same configuration as the first embodiment described above.

Such a thin film transistor 1 can also be manufactured in the same manner as the thin film transistor 1 according to the first embodiment.

According to the thin film transistor 1 of the second embodiment, the same performance and advantages as the thin film transistor 1 of the first embodiment can also be obtained.

Note that the electronic device according to the invention is not limited to the application as the thin film transistor described above, but can also be applied as, for example, an organic EL element, a photoelectric transducer, or the like.

<Display Device>

A display device equipped with an active matrix device comprising thin film transistors 1 as described above will now be described using an electrophoretic display device as an example.

Figure 5:
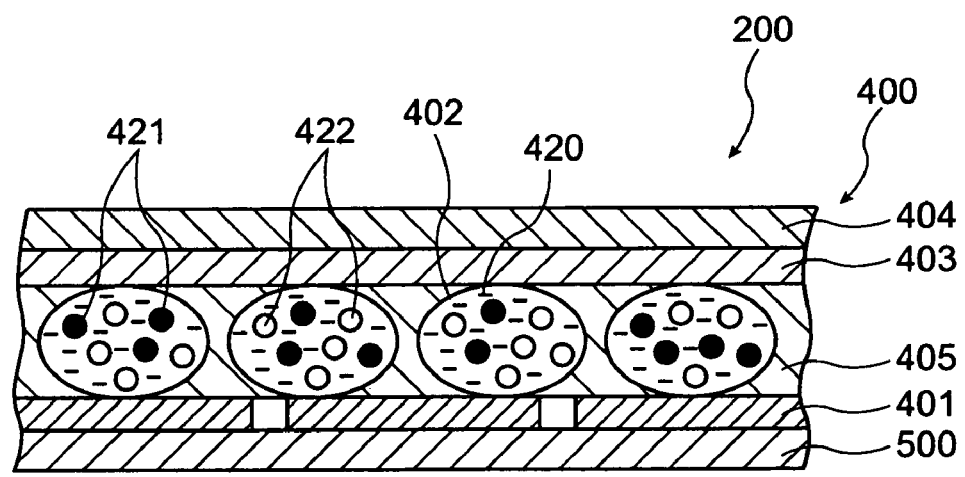
FIG. 5 is a vertical cross-sectional view showing an embodiment of an electrophoretic display device.
Figure 6:
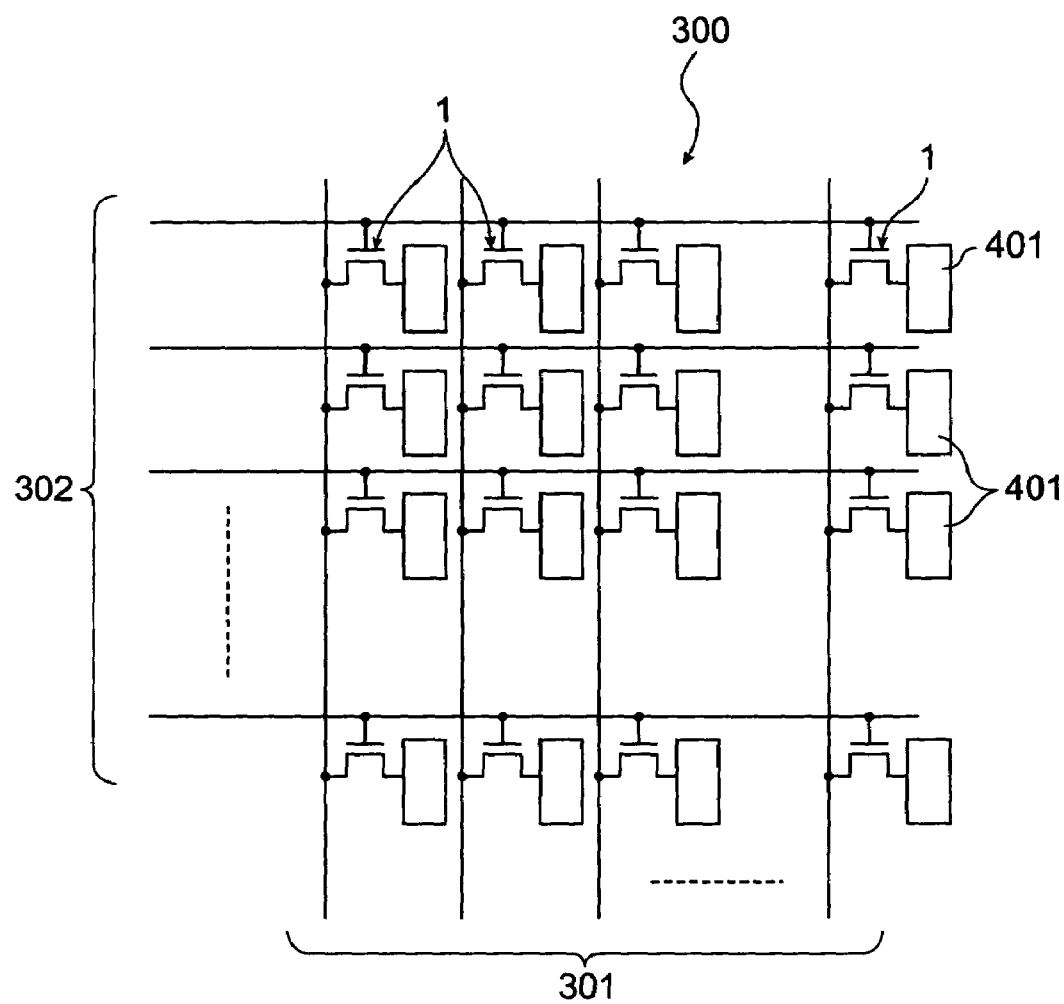
FIG. 6 is a block diagram showing a configuration of an active matrix device provided to the electrophoretic display device shown in FIG. 5.

FIG. 5 is a vertical cross-sectional view showing an embodiment of an electrophoretic display device. FIG. 6 is a block diagram showing a configuration of the active matrix device installed in the electrophoretic display device shown in FIG. 5.

The electrophoretic display device 200 shown in FIG. 5 is composed of an active matrix device 300 provided on a substrate 500 and an electrophoretic display section 400 electrically connected to the active matrix device 300.

As shown in FIG. 6, the active matrix device 300 comprises a plurality of data lines 301, a plurality of scanning lines 302 perpendicular to the plurality of data lines, and the thin film transistors 1 provided adjacent to each of the intersections of the data lines 301 and the scanning lines 302.

And, the gate electrodes 50, the source electrodes 20a, and the drain electrodes 20b provided to the thin film transistors 1 are respectively connected to the scanning lines 302, the data lines 301, and pixel electrodes (discrete electrodes) 401 described below.

As shown in FIG. 5, the electrophoretic display section 400 comprises the pixel electrodes 401, micro capsules 402, a transparent electrode (a common electrode) 403 and a transparent substrate 404 sequentially stacked on the substrate 500.

Further, the micro capsules 402 are fixed between the pixel electrode 401 and the transparent electrode 403 with a binder member 405.

The pixel electrode 401 is divided into a matrix, namely so as to be aligned vertically and horizontally with regularity.

In each of the capsules 402, electrophoretic dispersion liquid 420 including plural kinds of electrophoretic particles having different characteristics from each other, two kinds of electrophoretic particles 421 and 422 having different charges and colors (hues) in the present embodiment is encapsulated.

In the electrophoretic display device 200 as described above, if one or more of the scanning lines 302 are supplied with selection signals (selection voltages), the thin film transistors 1 connected to the scanning lines 302 supplied with the selection signals (selection voltages) are switched on.

Thus, the data lines 301 connected to these thin film transistors 1 and the pixel electrodes 401 are substantially electrically connected. In this case, if the desired data (voltages) are supplied to the data lines 301, the data (voltages) are then supplied to the pixel electrodes 401.

Accordingly, electric fields are generated between the pixel electrodes 401 and the transparent electrode 403, and the electrophoretic particles 421 and 422 are electrophoresed toward either of the electrodes in accordance with the direction and strength of the electric fields, the characteristics of the electrophoretic particles 421 and 422, and so on.

Meanwhile, in this state, when the supply of the selection signals (selection voltages) to the scanning lines 302 are stopped, the thin film transistors 1 are switched off bringing the data lines 301 and the pixel electrodes 401 connected to the thin film transistors 1 into electrically disconnected states.

Therefore, by executing start or stop of supplying the selection signals to the scanning lines 302, and start or stop of supplying the data to the data lines 301 in desired combination, desired images (information) can be displayed on the display surface side (the transparent substrate 404 side) of the electrophoretic display device 200.

In particular, in the electrophoretic display device 200 according to the present embodiment, the electrophoretic particles 421 and 422 are differently colored, thus enabling images with multiple grayscales to be displayed.

Further, since the electrophoretic display device 200 according to the present embodiment is equipped with the active matrix device 300, the thin film transistor 1 connected to a specific scanning line 302 can selectively be switched ON/OFF, thus the problem of cross-talk is difficult to arise, and further, the faster circuit operation is possible, which can provide high quality images (information).

Further, since the electrophoretic display device 200 according to the present embodiment can operate with lower drive voltages, lower power consumption can be realized.

Note that the display device implementing the active matrix device equipped with the thin film transistor 1 described above is not limited to an application to such an electrophoretic display device 200, but can be applied to, for example, a liquid crystal display device, or an organic or an inorganic EL display device.

<Electronic Apparatus>

The electrophoretic display device 200 as described above can be installed in various electronic apparatuses. The electronic apparatus according to an embodiment of the present invention equipped with the electrophoretic display device 200 is hereinafter described.

<<Electronic Paper>>

Firstly, an embodiment of applying the electronic apparatus according to the present invention to the electronic paper is explained.

Figure 7:
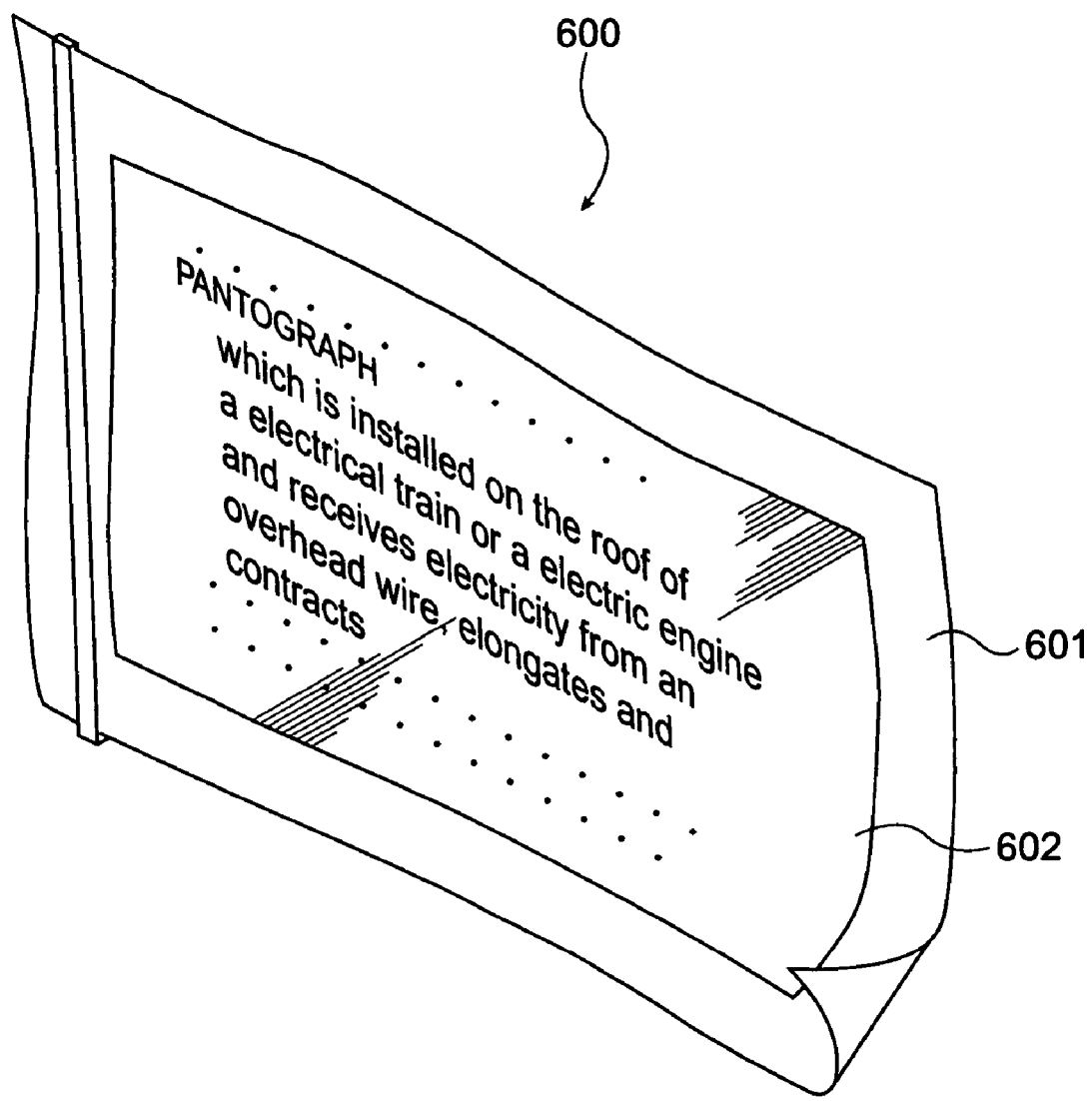
FIG. 7 is a perspective view showing an embodiment of applying the electronic apparatus according to the invention to an electronic paper.

FIG. 7 is a perspective view showing the embodiment of applying the electronic apparatus of the invention to the electronic paper.

The electronic paper 600 shown in this drawing is equipped with a main body 601 composed of a rewritable sheet offering the same feeling of quality and having the same flexibility as paper and a display unit 602.

In the electronic paper 600 as described above, the display unit 602 is composed of the electrophoretic display device 200 as described above.

<<Display>>

Then, an embodiment of applying the electronic apparatus of the invention to a display is explained.

Figure 8A:
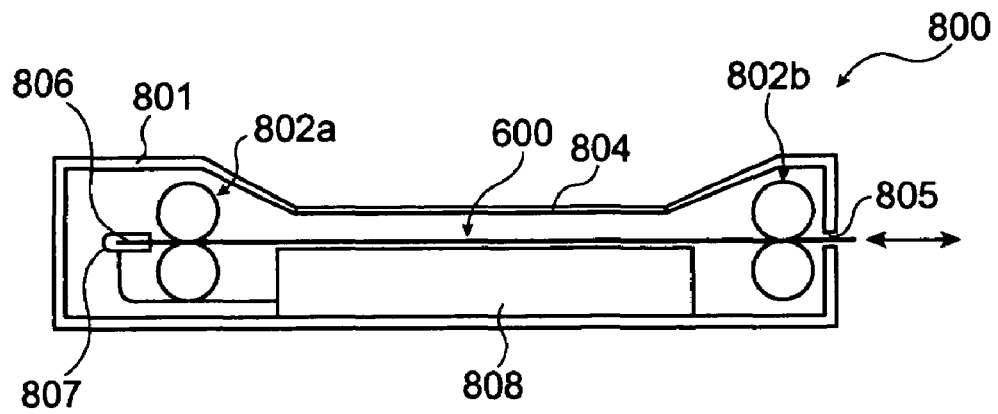
FIGS. 8A and 8B are schematic views showing an embodiment of applying the electronic apparatus according to the invention to a display.
Figure 8B:
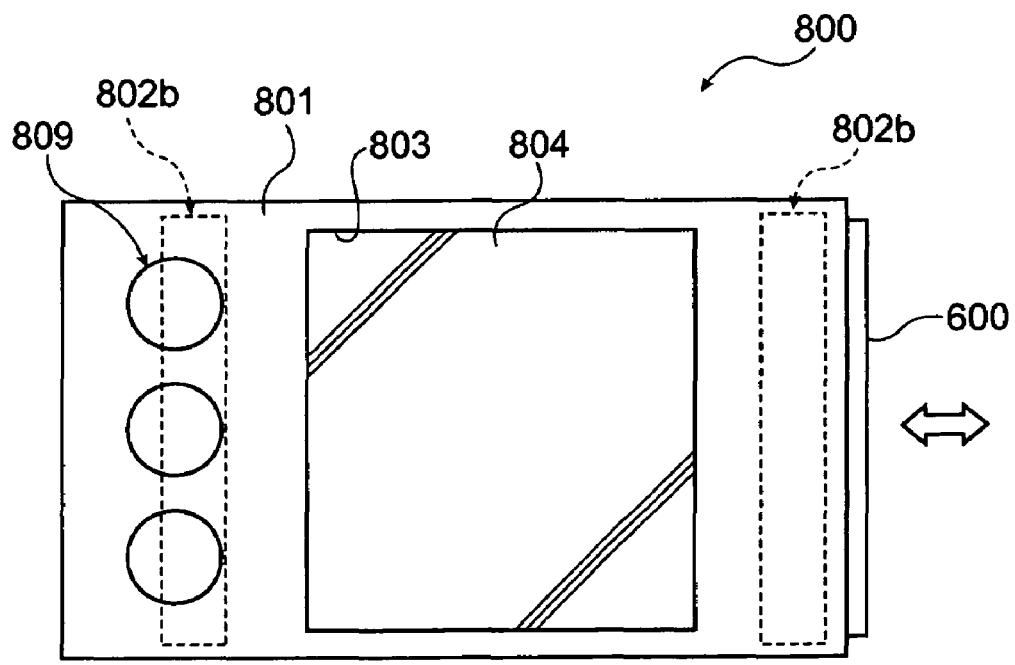

FIGS. 8A and 8B are views showing the embodiment of applying the electronic apparatus of the invention to the display, where FIG. 8A is a cross-sectional view, and FIG. 8B is a plan view.

The display 800 shown in the drawings is equipped with a main body 801 and the electronic paper 600 detachably mounted on the main body 801. Note that the configuration of the electronic paper 600 is as described above, namely the same as the configuration shown in FIG. 7.

The main body 801 is provided with an inlet 805 at a side thereof (right side of the figure) through which the electronic paper 600 can be inserted, and with two pairs of feed rollers 802a and 802b inside thereof. When the electronic paper 600 is inserted in the main body 801 through the inlet 805, the electronic paper 600 is positioned in the main body 801 while being held by the pairs of feed rollers 802a and 802b.

Further, in the display side (the near side of the paper in FIG. 8B) of the main body 801, there is formed a rectangular hollow section 803, in which a transparent glass plate 804 is engaged. Thus, the electronic paper 600 inserted and positioned in the main body 801 can be seen from outside the main body 801. Namely, in the display 800, the display surface is realized by making the electronic paper 600 positioned in the main body 801 be seen through the transparent glass plate 804.

Further, a terminal section 806 is provided on the tip portion of the electronic paper 600 in the inserting direction (left side in the drawing), and a socket 807 is provided inside the main body 801, to which the terminal section 806 is connected when the electronic paper 600 is positioned in the main body 801. The socket 807 is electrically connected to a controller 808 and an operation section 809.

In the display 800, since the electronic paper 600 is detachably mounted on the main body 801, it can also be carried and used while being detached from the main body 801.

Further, in the display 800 described above, the electronic paper 600 is composed of the electrophoretic display device 200 as described above.

Note that the application of the electronic apparatus according to the invention is not limited to those described above, but includes, for example, a television, a video cassette recorder of either a view-finder type or a direct view type, a car navigation system, a pager, a personal digital assistance, an electronic calculator, an electronic newspaper, a word processor, a personal computer, a workstation, a picture phone, a POS terminal, devices equipped with touch panels, and the electrophoretic display device 200 can be applied to display sections of the above various electronic apparatuses.

Although the descriptions regarding the electronic device, the method of manufacturing the electronic device, and the electronic apparatus according to the embodiments of the invention are given as the above, the invention is not limited to the above.

Further, configuration of each section of the electronic device and the electronic apparatus can be replaced with a desired configuration capable of comparably functioning thereto or added a desired configuration.

SPECIFIC EXAMPLES

Specific examples according to the present invention are hereinafter described.

Firstly, as the organic compounds, the following compounds (1) through (13) are prepared.

[Chemical Formula 1]

$$CF_3(CF_2)_9(CH_2)_2SH \tag{1}$$

[Chemical Formula 2]

$$CF_3(CF_2)_9(CH_2)_8SH \tag{2}$$

[Chemical Formula 3]

$$CF_3(CF_2)_9(CH_2)_{11}SH \tag{3}$$

[Chemical Formula 4]

$$CF_3(CF_2)_9(CH_2)_{17}SH \tag{4}$$

[Chemical Formula 5]

$$CF_3(CF_2)_9(CH_2)_{33}SH \tag{5}$$

[Chemical Formula 6]

$$CF_3(CF_2)_{12}(CH_2)_{17}SH \qquad (6)$$

[Chemical Formula 7]

$$CF_3(CH_2)_{11}SH \qquad (7)$$

[Chemical Formula 8]

$$CH_3(CH_2)_{11}SH \qquad (8)$$

[Chemical Formula 9]

$$CH_3(CH_2)_{17}SH \qquad (9)$$

[Chemical Formula 10]

$$HO(CH_2)_{11}SH \qquad (10)$$

[Chemical Formula 11]

$$HOOC(CH_2)_{10}SH \qquad (11)$$

[Chemical Formula 12]

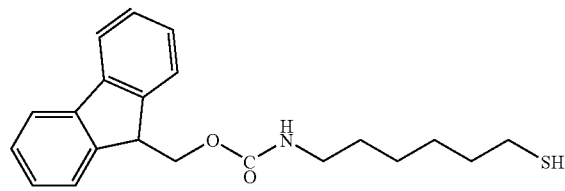

(12)

[Chemical Formula 13]

$$C_6F_5(CH_2)_2SH \qquad (13)$$

Specific Example 1

1-1. Manufacturing of Thin Film Transistor

Samples 1A through 17A of the thin film transistor are manufactured as described below as much as 200 units for each of the samples.

Sample No. 1A

Firstly, a glass substrate ("OA10" manufactured by Nippon Electric Glass Co., Ltd.) is prepared, washed with water, and then dried.

And then, a resist layer is formed using a lithography process on an area of the glass substrate other than the area thereof in which the source electrode and the drain electrode are to be formed.

And, after forming a gold thin film using a vapor deposition process on the surface of the glass substrate on which the resist layer is formed, the resist layer is then removed.

Thus, the drain electrode having an average thickness of 100 nm is formed.

Subsequently, an oxygen plasma treatment is executed on the surface of the glass substrate on which the source electrode and the drain electrode are formed.

Note that conditions of the oxygen plasma treatment are as described below.

| | |
|---|---|
| Process gas: | a pure oxygen gas |
| Flow rate of the process gas: | 100 sccm |
| RF power: | 0.05 W/cm$^2$ |
| Process time: | 300 sec |
| Ambient temperature: | 25° C. |
| Ambient pressure: | $1 \times 10^{-1}$ Pa |

Subsequently, the glass substrate provided with the source electrode and the drain electrode is dipped in 0.1 mM chloroform solution (the organic film forming fluid) of the compounds (1) for 0.05 minute.

Note that the temperature of the organic film forming fluid is set to be 20° C.

Thus, the organic film is formed on the surfaces of the source electrode and the drain electrode.

Note that the number of the compounds (1) coupled to the surfaces of the source electrode and the drain electrode is $0.01 \times 10^{15}/cm^2$.

Measurement of the number of the organic compounds coupled to the surfaces of the source electrode and the drain electrode is executed using a device such as QCM (Quarts Crystal Microbalance) or SPM (Scanning Probe Microscope).

Further, the distance (channel length L) between the source electrode provided with the organic film and the drain electrode provided with the organic film is 20 μm, and the channel width W is 1 mm.

Subsequently, 1% (wt/vol) toluene solution of fluorene-bithiophene copolymer (F8T2) is coated on the glass substrate by the spin coating process (2400 rpm), and then dried at 60° C. for 10 minutes.

Thus, the organic semiconductor layer with an average thickness of 50 nm is formed.

And then, 5% (wt/vol) butyl acetate solution of polymethylmethacrylate (PMMA) is coated on the organic semiconductor layer by the spin coating process (2400 rpm), and then dried at 60° C. for 10 minutes. Subsequently, 2% (wt/vol) butanol solution of polyvinylphenol (PVP) is coated thereon by the spin coating process (2400 rpm), and then dried at 60° C. for 10 minutes.

Thus, the double layered gate insulating layer with an average thickness (total) of 500 nm is formed.

Subsequently, water dispersion of Ag microparticles is coated on an area corresponding to the area between the source electrode and the drain electrode using an inkjet process, and then dried at 80° C. for 10 minutes.

Thus, the gate electrode with an average thickness of 100 nm, and an average width of 30 μm is formed.

By the above processes, the thin film transistors of the sample No. 1A are obtained.

Sample Nos. 2A through 16A

The thin film transistors of the sample Nos. 2A through 16A are manufactured similarly to the sample No. 1A described above with the organic film forming fluid and dipping time of the substrate in the organic film forming fluid modified as shown in Table 1.

Sample No. 17A

The thin film transistors of the sample No. 17A are manufactured similarly to the sample No. 1A described above with the formation of the organic films omitted.

Note that the maximum thickness of the organic films formed in the thin film transistors of each of sample Nos. 1A through 14A is shorter than the length of the repeated structure of the methylene group included in the corresponding one of the compounds (1), (2), and (7) through (11) used for forming the respective organic films.

1-2. Evaluation

For thin film transistors of each of the sample numbers, the drain current value Id, the threshold voltage value Vth, and the S value are measured under the nitrogen atmosphere.

Note that the threshold voltage Vth denotes a gate voltage value when the value of the approximate expression (relational expression) expressing the relationship between the gate voltage and $Id^{1/2}$ makes zero, which can be assumed as a gate voltage value necessary for the drain current to start flowing.

Further, the S value denotes a gate voltage value necessary for the drain current value to increase as much as one digit.

Note that each of these values is measured immediately after the thin film transistors are manufactured and after being left in the nitrogen atmosphere for three weeks.

Further, the drain current value Id is measured while applying the potential difference of 40V between the source electrode and the drain electrode, and changing the gate voltage value.

The results are shown in Table 1.

Note that the drain current values Id in Table 1 are values under the gate voltage of −40V.

Further, each of the values in Table 1 denotes an average value of the 200 thin film transistors.

TABLE 1

Table 1 (Specific Example 1)

| SAMPLE No. | ORGANIC FILM FORMING FLUID | | | DIPPING TIME [minute] | NUMBER OF ORGANIC COMPOUND COUPLED TO ELECTRODE SURFACE [×10^15/cm²] | DRAIN CURRENT VALUE Id [nA] | | THRESHOLD VOLTAGE Vth [V] | | S VALUE [V] | |
|---|---|---|---|---|---|---|---|---|---|---|---|
| | ORGANIC COMPOUND | SOLVENT | CONCENTRATION [mM] | | | IMMEDIATELY AFTER | 3 WEEKS LATER | IMMEDIATELY AFTER | 3 WEEKS LATER | IMMEDIATELY AFTER | 3 WEEKS LATER |
| 1A (Invention) | Compound (1) | Chloroform | 0.1 | 0.05 | 0.01 | 509 | 460 | −1 | −2 | 2.0 | 2.0 |
| 2A (Invention) | Compound (1) | Chloroform | 0.1 | 0.5 | 0.19 | 596 | 563 | −1 | −2 | 1.7 | 1.7 |
| 3A (Invention) | Compound (1) | Chloroform | 0.1 | 3 | 0.48 | 877 | 869 | 0 | 0 | 1.3 | 1.3 |
| 4A (Invention) | Compound (1) | Chloroform | 0.1 | 5 | 0.79 | 954 | 955 | 0 | 0 | 1.0 | 1.0 |
| 5A (Invention) | Compound (1) | Chloroform | 0.1 | 30 | 0.91 | 963 | 960 | 0 | 0 | 1.0 | 1.0 |
| 6A (Invention) | Compound (1) | Chloroform | 0.1 | 100 | 0.93 | 856 | 849 | 0 | 0 | 1.1 | 1.1 |
| 7A (Invention) | Compound (1) | Chloroform | 0.1 | 200 | 0.95 | 598 | 593 | −1 | −1 | 1.7 | 1.7 |
| 8A (Invention) | Compound (1) | Chloroform | 0.1 | 270 | 0.97 | 485 | 486 | −1 | 0 | 1.9 | 1.9 |
| 9A (Invention) | Compound (2) | Chloroform | 0.1 | 30 | 0.89 | 876 | 873 | 0 | 0 | 1.0 | 1.0 |
| 10A (Invention) | Compound (7):compound (1) = 80:20 (molar ratio) | Chloroform | 0.1 | 30 | 0.91 | 801 | 785 | −1 | −1 | 1.8 | 1.8 |
| 11A (Invention) | Compound (8):compound (1) = 80:20 (molar ratio) | Chloroform | 0.1 | 30 | 0.88 | 698 | 678 | −2 | −2 | 1.7 | 1.7 |
| 12A (Invention) | Compound (9):compound (1) = 70:30 (molar ratio) | Chloroform | 0.1 | 30 | 0.87 | 657 | 643 | −2 | −2 | 1.8 | 1.81 |
| 13A (Invention) | Compound (10):compound (1) = 70:30 (molar ratio) | Chloroform | 0.1 | 30 | 0.89 | 676 | 663 | −3 | −3 | 2.0 | 2.0 |
| 14A (Invention) | Compound (11):compound (1) = 70:30 (molar ratio) | Chloroform | 0.1 | 30 | 0.86 | 695 | 687 | −2 | −2 | 2.0 | 2.0 |
| 15A (Comparing) | Compound (12) | Chloroform | 0.1 | 30 | 0.83 | 545 | 530 | −4 | −4 | 2.3 | 2.4 |
| 16A (Comparing) | Compound (13) | Chloroform | 0.1 | 30 | 0.85 | 586 | 563 | −3 | −3 | 2.0 | 2.0 |
| 17A (Comparing) | — | | | | | 438 | 218 | −1 | −5 | 2.2 | 2.6 |

As shown in Table 1, the performances of the thin film transistors (according to the embodiments of the invention) of sample Nos. 1A through 14A are maintained even after three weeks have passed. Namely, it becomes obvious that the performances of all of these transistors are hard to be degraded with time.

Further, by using organic compounds each including four or more of fluoro groups as the organic compounds forming the organic film (sample Nos. 1A through 9A), the thin film transistors of superior performances can be obtained.

Further, by appropriately setting the number of the organic compounds to be coupled to the surfaces of the source electrode and the drain electrode, the performances of the thin film transistors show tendencies of enhancing, and particularly in the thin film transistors of sample Nos. 4A and 5A, high performances can be obtained.

In contrast, the thin film transistors (comparing samples) of sample Nos. 15A through 17A are all inferior in the performance, and in particular, in the thin film transistors of sample No.17A from which the organic films are omitted, significant degradation in the performances is observed after three weeks have passed.

Specific Example 2

2-1. Manufacturing of Thin Film Transistor

The thin film transistors of sample Nos. 1B through 4B are manufactured as described below as much as 200 units for each of the sample numbers.

Sample No. 1B

The thin film transistors of the sample No. 1B are manufactured similarly to those of sample No. 5A described above.

Sample No. 2B

The thin film transistors of sample No. 2B are manufactured similarly to those of sample No. 1B except that an argon plasma treatment is executed on the surfaces of the source electrode and the drain electrode instead of the oxygen plasma treatment.

Note that conditions of the argon plasma treatment are as described below.

| Process gas: | a pure argon gas |
|---|---|
| Flow rate of the process gas: | 100 sccm |
| RF power: | 0.05 W/cm$^2$ |
| Process time: | 300 sec |
| Ambient temperature: | 25° C. |
| Ambient pressure: | $1 \times 10^{-1}$ Pa |

Sample No. 3B

The thin film transistors of sample No. 3B are manufactured similarly to those of sample No. 1B except that an ultraviolet/ozone treatment is executed on the surfaces of the source electrode and the drain electrode instead of the oxygen plasma treatment.

Note that conditions of the ultraviolet/ozone treatment are as described below.

| Wavelength of the ultraviolet ray: | 254 nm |
|---|---|
| Intensity of the ultraviolet ray: | 0.01 W/cm$^2$ |
| Process time: | 900 sec |
| Ambient atmosphere: | atmospheric air (Ozone is generated by irradiation with the ultraviolet ray.) |
| Ambient temperature: | 25° C. |
| Ambient pressure: | atmospheric pressure |

Sample No. 4B

The thin film transistors of sample No. 4B are manufactured similarly to those of sample No. 1B except that the oxygen plasma treatment on the surfaces of the source electrode and the drain electrode is omitted.

Note that the maximum thickness of the organic films formed in the thin film transistors of each of sample Nos. 1B through 4B is shorter than the length of the repeated structure of the methylene group included in the compound (1).

2-2. Evaluation

For thin film transistors of each of the sample numbers, the drain current value Id, the threshold voltage value Vth, and the S value are measured under the nitrogen atmosphere.

Note that each of these values is measured immediately after the thin film transistors are manufactured.

Further, the drain current value Id is measured while applying the potential difference of 40V between the source electrode and the drain electrode, and changing the gate voltage value.

The results are shown in Table 2.

Note that the drain current values Id in Table 2 are values under the gate voltage of −40V.

Further, each of the values in Table 2 denotes an average value of the 200 thin film transistors.

TABLE 2

Table 2 (Specific Example 2)

| SAMPLE No. | ORGANIC FILM FORMING FLUID | | | DIPPING TIME [minute] | SURFACE TREATMENT OF ELECTRODE | DRAIN CURRENT VALUE Id [nA] | THRESHOLD VOLTAGE Vth [V] | S VALUE [V] |
|---|---|---|---|---|---|---|---|---|
| | ORGANIC COMPOUND | SOLVENT | CONCENTRATION [mM] | | | | | |
| 1B (Invention) | Compound (1) | Chloroform | 0.1 | 30 | Oxygen plasma | 968 | 0 | 1.0 |
| 2B (Invention) | Compound (1) | Chloroform | 0.1 | 30 | Argon plasma | 735 | −1 | 2.0 |

TABLE 2-continued

Table 2 (Specific Example 2)

| SAMPLE No. | ORGANIC FILM FORMING FLUID | | | DIPPING TIME [minute] | SURFACE TREATMENT OF ELECTRODE | DRAIN CURRENT VALUE Id [nA] | THRESHOLD VOLTAGE Vth [V] | S VALUE [V] |
|---|---|---|---|---|---|---|---|---|
| | ORGANIC COMPOUND | SOLVENT | CONCENTRATION [mM] | | | | | |
| 3B (Invention) | Compound (1) | Chloroform | 0.1 | 30 | Ultraviolet/ozone | 767 | −1 | 2.1 |
| 4B (Invention) | Compound (1) | Chloroform | 0.1 | 30 | — | 778 | 0 | 1.9 |

As shown in Table 2, it becomes obvious that, by executing the oxygen treatment on the surfaces of the source electrode and the drain electrode prior to formation of the organic films, the thin film transistors superior in the performance can be obtained.

Specific Example 3

3-1. Manufacturing of Thin Film Transistor

The thin film transistors of sample Nos. 1C through 7C are manufactured as described below as much as 200 units for each of the sample numbers.

Sample No. 1C

The thin film transistors of the sample No. 1C are manufactured similarly to those of sample No. 5A described above.

Sample Nos. 2C through 6C

The thin film transistors of the sample Nos. 2C through 6C are manufactured similarly to the sample No. 1C described above with the organic film forming fluid modified as shown in Table 3.

Sample No. 7C

The thin film transistors of the sample No. 7C are manufactured similarly to the sample No. 1C described above with the formation of the organic films omitted.

Note that the maximum thickness of the organic films formed in the thin film transistors of each of sample Nos. 1C through 6C is shorter than the length of the repeated structure of the methylene group included in the corresponding one of the compounds (1) through (6) used for forming the respective organic films.

3-2. Evaluation

For the thin film transistors of each of sample numbers, the drain current values Id are measured.

Note that the drain current values are measured in the nitrogen atmosphere immediately after manufacturing the thin film transistors, and in the atmospheric air after being left in the atmospheric air for a day.

Further, the drain current value Id is measured while applying the potential difference of 40V between the source electrode and the drain electrode, and changing the gate voltage value.

The results are shown in Table 3.

Further, each of the values in Table 3 denotes an average value of the 200 thin film transistors.

TABLE 3

Table 3 (Specific Example 3)

| | ORGANIC FILM FORMING FLUID | | | | DRAIN CURRENT VALUE Id [nA] | | | |
|---|---|---|---|---|---|---|---|---|
| | | | | | ON CURRENT VALUE $Id_{ON}$ | | OFF CURRENT VALUE $Id_{OFF}$ | |
| SAMPLE No. | ORGANIC COMPOUND | SOLVENT | CONCENTRATION [mM] | DIPPING TIME [minute] | IMMEDIATELY AFTER (NITROGEN ATMOSPHERE) | 1 DAY LATER (ATMOSPHERE) | IMMEDIATELY AFTER (NITROGEN ATMOSPHERE) | 1 DAY LATER (ATMOSPHERE) |
| 1C (Invention) | Compound (1) | Chloroform | 0.1 | 30 | 965 | 758 | $9 \times 10^{-3}$ | $9 \times 10^{-3}$ |
| 2C (Invention) | Compound (2) | Chloroform | 0.1 | 30 | 935 | 717 | $9 \times 10^{-3}$ | $9 \times 10^{-3}$ |
| 3C (Invention) | Compound (3) | Chloroform | 0.1 | 30 | 917 | 681 | $9 \times 10^{-3}$ | $1 \times 10^{-2}$ |
| 4C (Invention) | Compound (4) | Chloroform | 0.1 | 30 | 896 | 591 | $9 \times 10^{-3}$ | $1 \times 10^{-2}$ |
| 5C (Invention) | Compound (5) | Chloroform | 0.1 | 30 | 852 | 349 | $9 \times 10^{-3}$ | $2 \times 10^{-2}$ |
| 6C (Invention) | Compound (6) | Chloroform | 0.1 | 30 | 876 | 555 | $9 \times 10^{-3}$ | $1 \times 10^{-2}$ |
| 7C (Comparing) | | — | | | 485 | 50 | $9 \times 10^{-3}$ | $3 \times 10^{-2}$ |

As shown in Table 3, the thin film transistors (according to the embodiments of the invention) of sample Nos. 1C through 6C are all superior in the performance.

Further, degradation in performances of all of these thin film transistors after being left in the atmospheric air is obviously minor in comparison with the thin film transistors (comparing example) of sample No. 7C.

Further, by appropriately setting the number of ($CF_2$) units and the number of ($CH_2$) units of the organic compounds forming the organic film, the degradation in performance after leaving in the atmospheric air shows a tendency of being suppressed, and particularly high suppressing effects can be observed in the thin film transistors of sample Nos. 1C and 2C.

Further, as is obvious from comparison of Tables 1 through 3, the thin film transistors according to the embodiments of the invention provided with the organic films have small variations in the performances if manufactured in the same conditions (comparing sample Nos. 5A, 1B, and 1C). On the contrary, the thin film transistors of the comparing examples without the organic films have remarkable variations in the performances even if manufactured under the same conditions (comparing sample Nos. 17A and 7C).

What is claimed is:

1. An electronic device comprising:
   a first electrode;
   a second electrode;
   an organic semiconductor layer, a part of the organic semiconductor layer being formed between the first electrode and the second electrode; and
   an organic material formed on a surface of at least one of the first electrode and the second electrode, the organic material including a nonconjugated organic compound,
      the nonconjugated organic compound including a coupling group, the coupling group being coupled to one part of the surface of at least one of the first electrode and the second electrode, the other part of the surface of at least one of the first electrode and the second electrode not being coupled to any of the coupling group,
      the nonconjugated organic compound having a structure that presents a water repellent property at the opposite side to the coupling group, and
      the nonconjugated organic compound being described as having a general formula: $CF_3(CF_2)_m(CH_2)_nSH$, m representing an integer from 1 to 35, n representing an integer from 2 to 33.

2. The electronic device according to claim 1, the other part of the surface of at least one of the first electrode and the second electrode having a space where the coupling group can further be coupled.

3. The electronic device according to claim 1, the organic material including coupling groups, being SH groups.

4. The electronic device according to claim 1 the nonconjugated organic compounds further including a substitutional group that is located at an opposite side to the coupling group, the substitutional group being capable of supplying the organic semiconductor layer.

5. The electronic device according to claim 4, the nonconjugated organic compounds forming a straight chain, a length from the coupling group to the substitutional group being larger than a thickness of the organic material.

6. The electronic device according to claim 1, the m and n of the general formula satisfying the following relationship: $0.25 \leq m/n \leq 18$.

7. The electronic device according to claim 1, the nonconjugated organic compound having a total carbon number of 4 through 45.

8. The electronic device according to claim 1, a plurality of the organic compounds being coupled to the surface of the electrode, a number of the plurality of the organic compounds being in a range of $0.05 \times 10^{15}$ through $0.96 \times 10^{15}$/$cm^2$.

9. The electronic device according to claim 1, the at least one of the first electrode and the second electrode being prevented from directly contacting with the organic semiconductor layer by presence of the organic material.

10. The electronic device according to claim 1, the at least one of the first electrode and the second electrode being composed of one or more of Au, Ag, Cu, Pt, and alloys including one or more of Au, Ag, Cu, and Pt as a principal material.

11. An electronic apparatus comprising the electronic device according to claim 1.

12. An electronic device comprising:
   a first electrode;
   a second electrode;
   an organic material formed on a surface of at least one of the first electrode and the second electrode, the organic material including a nonconjugated organic compound,
      the nonconjugated organic compound including a coupling group, the coupling group being coupled to one part of the surface of at least one of the first electrode and the second electrode, the other part of the surface of at least one of the first electrode and the second electrode not being coupled to any of the coupling group,
      the nonconjugated organic compound having a structure that presents a water repellent property at the opposite side to the coupling group, and
      the nonconjugated organic compound being described as having a general formula: $CF_3(CF_2)_m(CH_2)_nSH$, m representing an integer from 1 to 35, n representing an integer from 2 to 33;
   an organic semiconductor layer, a part of the organic semiconductor layer being formed between the first electrode and the second electrode;
   an insulating layer formed over the organic semiconductor layer; and
   a gate electrode being formed over the part of the organic semiconductor layer.

13. The electronic device according to claim 12, the other part of the surface of at least one of the first electrode and the second electrode having a space where the coupling group can further be coupled.

14. The electronic device according to claim 12, the at least one of the first electrode and the second electrode being prevented from directly contacting with the organic semiconductor layer by presence of the organic material.

15. The electronic device according to claim 12, the at least one of the first electrode and the second electrode being composed of one or more of Au, Ag, Cu, Pt, and alloys including one or more of Au, Ag, Cu, and Pt as a principal material.

16. A method of manufacturing an electronic device, comprising:
   forming a first electrode and a second electrode;
   forming an organic material on at least one of the first electrode and the second electrode, the organic material including a nonconjugated organic compound that is coupling to at least one part of the surface of the at least one of the first electrode and the second electrode, an other part of the surface of the at least one of the first electrode and the second electrode not being coupled to any of the coupling group, the nonconjugated organic compound having a structure that presents a water repellent property at the opposite side to the coupling group, and the nonconjugated organic compound being described as having a general formula: $CF_3(CF_2)_m(CH_2)_n SH$, m representing an integer from 1 to 35, n representing an integer from 2 to 33, and forming a organic semiconductor layer over the first electrode and the second electrode, the semiconductor layer being contact to the organic material.

17. The method according to claim 16 comprising:

cleaning a surface of the at least one of the first electrode and the second electrode before the forming of the organic material, the cleaning being executed with an oxygen plasma treatment.

18. The method according to claim 17, the organic material being formed by contacting a liquid material for 0.1 through 200 minutes, the liquid material including the nonconjugated organic compound, a concentration of the nonconjugated organic compound in the liquid material being 0.01 through 10 mM.

19. A method of manufacturing an electronic apparatus using the method of manufacturing an electronic device according to claim 16.

* * * * *